US006794944B2

(12) United States Patent
Hirai

(10) Patent No.: US 6,794,944 B2
(45) Date of Patent: Sep. 21, 2004

(54) LOCK DETECTION CIRCUIT

(75) Inventor: Yoshitaka Hirai, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 50 days.

(21) Appl. No.: 10/118,249

(22) Filed: Apr. 9, 2002

(65) Prior Publication Data
US 2002/0180540 A1 Dec. 5, 2002

(30) Foreign Application Priority Data
Apr. 10, 2001 (JP) ......................................... 2001-111297

(51) Int. Cl.$^7$ ............................................... H03L 7/00
(52) U.S. Cl. ......................................... 331/1 A; 331/17
(58) Field of Search ..................... 331/1 A, 17, DIG. 2, 331/8, 25; 327/105, 156–159

(56) References Cited

U.S. PATENT DOCUMENTS

| | | | | |
|---|---|---|---|---|
| 5,126,690 A | * | 6/1992 | Bui et al. ..................... | 331/1 A |
| 5,394,444 A | * | 2/1995 | Silvey et al. ................ | 375/374 |
| 5,400,034 A | * | 3/1995 | Smith .......................... | 342/103 |
| 5,870,002 A | * | 2/1999 | Ghaderi et al. .............. | 331/17 |
| 6,259,290 B1 | | 7/2001 | Takada et al. | |
| 6,429,901 B1 | * | 8/2002 | Kiyose et al. ............... | 348/500 |

FOREIGN PATENT DOCUMENTS

| | | |
|---|---|---|
| JP | 10-322200 | 12/1998 |
| KR | 2000-6536 | 1/2000 |

OTHER PUBLICATIONS

Korean Office Action dated Nov. 25, 2003 with Japanese Translation and Partial English Translation.

* cited by examiner

Primary Examiner—Robert Pascal
Assistant Examiner—Joseph Chang
(74) Attorney, Agent, or Firm—McGinn & Gibb, PLLC

(57) ABSTRACT

There is provided a lock detection circuit for optimizing a lock detection time and an unlock detection time of a PLL circuit. The present invention has counters 21 and 22 for inputting and counting feedback signals and reference signals inputted to a phase comparator 11 of a PLL circuit 10; a comparison circuit 23 for inputting and comparing count values of the counters 21 and 22 and outputting a control signal in an active state when the count value of the counter 21 is a first value and the count value of the counter 22 is the first value; a counter 24 for counting the feedback signals when the control signal outputted from the comparison circuit 23 is active; and a decision circuit 25 for outputting an output signal of a value showing a lock state when a count value of the counter 24 reaches a second value. The comparison circuit 23 resets the counter 24 when the count value of the counter 21 is the first value and the count value of the counter 22 is not the first value.

20 Claims, 7 Drawing Sheets

| 1 FEED BACK SIGNAL (INVERTED) | 4 COUNTER 1 OUTPUT | 3 COUNTER 2 OUTPUT | 2 COUNTER 3 OUTPUT | OUTPUT |
|---|---|---|---|---|
| ⤴ | 0 | × | × | HOLD |
| ⤴ | 1 | 0 | × | 0 (UNLOCK) |
| ⤴ | × | 1 | 0 | HOLD |
| ⤴ | 0 | 1 | 1 | HOLD |
| ⤴ | 1 | 1 | 1 | 1 (LOCK) |

COUNTERS 1,2 AND 3 OUTPUT 1 AT FULL COUNT

SELECTOR: WHEN S = 0, A IS OUTPUTTED ; WHEN S =1 , B IS OUTPUTTED

LOCK DETECTION CIRCUIT

BACKGROUND OF THE INVENTION

1. Field of the Invention

The present invention relates to a lock detection circuit, more specifically to a lock detection circuit provided with counters.

2. Description of the Prior Art

In recent years, attention has been given to a lock detection circuit using a counter for detecting a lock state of a Phase Locked Loop (PLL) circuit. For example, Japanese Published Unexamined Patent Application No. Hei 10-322200 discloses, as shown in FIG. 8, a phase lock detection circuit in which a count period generation circuit generates a count period from an input reference signal, a counter counts output signals of a PLL circuit during the count period, and a comparison circuit compares count values.

In a prior art PLL circuit 130, as shown in FIG. 9, an input reference signal RCLK (a frequency fR) 137 from outside is divided by a frequency divider 136 so that its frequency is 1/M of that of the input reference signal (a frequency fM). The M frequency division signal MCLK is a reference signal which is one of two inputs to a phase comparator 131. A comparison signal which is the other input to the phase comparator 131 is an N frequency division signal NCLK (a frequency fN) obtained by dividing an output signal OCLK (a frequency fOUT) 138 from the PLL circuit 130 using a frequency divider 135 so as to provide a frequency of 1/N. The phase comparator 131 inputs as a reference signal and a comparison signal an M frequency division signal corresponding to a reference signal inputted to the PLL circuit 130 and an N frequency division signal corresponding to an output signal from the PLL circuit 130, and detects a phase difference between both signals to output phase comparison result signals UP/DOWN corresponding to the phase difference. A charge pump 132 charges a capacitance (not shown; it may be a capacitance in a loop filter) while the UP signal from the phase comparator 131 is active and discharges the capacitance when the DOWN signal is active. The charge pump 132 is turned off when both the UP pulse and the DOWN pulse are inactive. A loop filter 133 flattens an output signal of the charge pump 132. Its output voltage is supplied as a controlled voltage to a voltage controlled oscillator (VCO) 134. The VCO 134 outputs a signal which changes an oscillation frequency corresponding to a direct current voltage of the output of the loop filter 133. This signal becomes the output signal OCLK from the PLL circuit 130. The output signal OCLK is inputted to the N frequency divider 135. The N frequency division signal NCLK in which the frequency of the output signal OCLK is divided to be 1/N is inputted as a feedback signal to the phase comparator 131. The M frequency divider and the N frequency divider need not be provided when M=1 and N=1. A PLL circuit not having the M frequency divider 136 or the N frequency divider 135 may exist.

A count period generation circuit 142 inputs the input reference signal 137 to the PLL circuit 130 to generate a count period signal pulse synthesized therewith having a pulse length of a predetermined multiple of its cycle. An output signal counter 144 uses the count period signal pulse as an enable signal to count the number of waves (the number of cycles) of the output signals 138 outputted from the PLL circuit 130 during the pulse period. To a count value comparison circuit 148, is set a predetermined reference count value based on design values of the time length of the count period signal pulse and a frequency conversion ratio in the PLL circuit 130. A lock decision circuit 146 decides a phase lock state between the input and output signals of the integrated PLL circuit 130 from a difference between a reference count value and an output count value measured in the output signal counter 144.

The lock detection circuit which uses a counter to count output signals of the PLL circuit during a predetermined count period, and then compares it with a reference count value to detect lock/unlock has the problem that the time to detect the lock state or the unlock state may be longer than required. The reason is as follows.

In the prior art lock detection circuit shown in FIG. 8, until the count period generated in the count period generation circuit 142 is terminated, the count value comparison circuit 148 cannot compare a count value of the number of waves of the output signals OCLK with the reference count value and can decide the lock or unlock state only during each count period generated in the count period generation circuit 142. In other words, the comparison operation of the counter for deciding the lock state is performed once during each count period. When the lock state is changed to the unlock state, the unlock state is detected after the count period similar to that of the lock state decision.

In this manner, in the prior art lock detection circuit, one counter counts output signals over the same count period to detect lock or unlock so that the lock detection time and the unlock detection time cannot be set to an optimal value.

SUMMARY OF THE INVENTION

An object of the present invention is to provide a lock detection circuit which optimizes the lock detection time and the unlock detection time of a PLL circuit.

According to an aspect of the present invention to provide means for solving the foregoing problems, a lock detection circuit has a phase comparison circuit for comparing the phases of a reference signal and a feedback signal based on an output signal to output a comparison result; an oscillation circuit for changing an oscillation frequency of the output signal based on the comparison result; and a detection circuit for detecting that coincidence of a frequency of the feedback signal and a frequency of the reference signal is maintained during a predetermined period to allow a lock signal to be active.

A high precision lock signal can be thus generated using a digital value of a frequency.

According to another aspect, a lock detection circuit has a first counter for inputting and counting the feedback signals inputted to the one input terminal of a phase comparator of a PLL circuit; a second counter for inputting and counting the reference signals inputted to the other input terminal of the phase comparator; a third counter for performing a count operation when a count value of the first counter coincides with a predetermined first value and a count value of the second counter coincides with the first value; and a decision circuit for outputting a signal showing a lock state when a count value of the third counter coincides with a predetermined second value.

According to the present invention, the lock detection circuit may have a comparison circuit for outputting a signal in a state showing coincidence when a count value of the first counter coincides with a predetermined first value and a count value of the second counter coincides with the first value, wherein the third counter inputs the signal outputted from the comparison circuit as a signal to control a count operation, is allowed to be in a count enable state when the signal outputted from the comparison circuit is in a state showing the coincidence, and counts the feedback signals inputted to the third counter.

According to the present invention, the comparison circuit resets the third counter when a count value of the first counter reaches a predetermined first value and a count value of the second counter is not the first value, and the decision circuit outputs an output signal of a value showing an unlock state when a count value of the third counter is reset. As is apparent in the description below, the foregoing problems can be solved by claims of the present invention likewise.

DETAILED DESCRIPTION OF THE PREFERRED EMBODIMENTS

Figure 1:
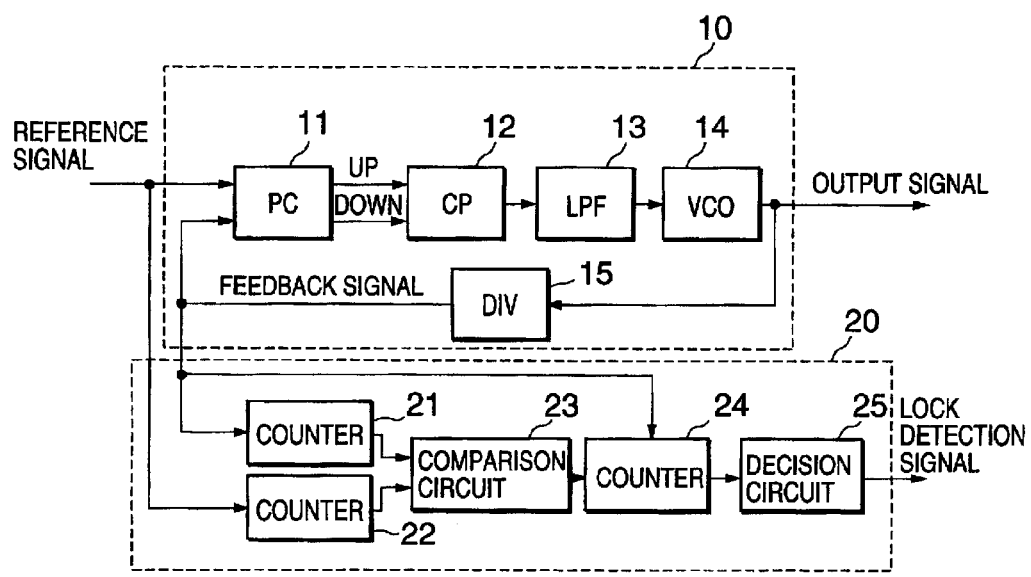
FIG. 1 is a diagram showing the construction of an embodiment of the present invention.

A preferred embodiment of the present invention will be described. In the embodiment of the present invention, a lock detection circuit of a PLL circuit which outputs an output signal having the same frequency as that of a reference signal inputted or a frequency obtained by multiplying the frequency by N has a first counter (the numeral 21 of FIG. 1) for counting signals (first signals) obtained by dividing the output signal by a frequency division value of 1 or N; a second counter (the numeral 22 of FIG. 1) for counting reference signals (second signals); and a third counter (the numeral 24 of FIG. 1) for counting up when the first counter counts the first signals by a predetermined first value and the second counter counts the second signals by a second value defined by the first value and the frequency division value. A decision circuit (the numeral 25 of FIG. 1) decides a lock state when a count value of the third counter (the numeral 24 of FIG. 1) becomes a predetermined third value. The state is updated during each period in which the first counter (the numeral 21 of FIG. 1) counts the first signals by the first value. When the first counter (the numeral 21 of FIG. 1) counts the first signals by the first value and the second counter (the numeral 22 of FIG. 1) counts the second signals by a value different from the second value, the unlock state is decided. In such a construction, when the frequencies of the first signal and the second signal are the same, the first and second values in the first and second counters are equal.

As a modification of the embodiment of the present invention, when using as a first signal inputted to the first counter (the numeral 21 of FIG. 1), an output signal of the PLL circuit (the numeral 10 of FIG. 1) having a frequency obtained by multiplying by N a frequency of a reference signal (the frequency divider (the numeral 15 of FIG. 1) divides the output signal of the PLL circuit by N), the second value of the second counter (the numeral 22 of FIG. 1) for counting reference signals is set to 1/N (provided that N is a frequency division value) of the first value as a set value of the first counter. When the first counter (the numeral 21 of FIG. 1) counts K-piece first signals (obtained by multiplying a frequency of the reference signal by N), the second counter (the numeral 22 of FIG. 1) counts K/N-piece reference signals.

An embodiment of the present invention will be described with reference to the drawings. Referring to FIG. 1, a PLL circuit (10) has a voltage controlled oscillator (14) for varying and outputting an oscillation frequency based on a controlled voltage; a frequency divider (15) for dividing an output signal of the voltage controlled oscillator (14); a phase comparator (11) for inputting a reference signal inputted and a signal divided by the frequency divider (15) (a feedback signal) to compare the phases of two signals; a charge pump (12) for charging and discharging a capacitance based on the phase comparison result from the phase comparator (11) to generate a voltage corresponding to a phase difference between the reference signal and the feedback signal; and a filter (13) for flattening the voltage corresponding to the phase difference which is supplied as a controlled voltage to the voltage controlled oscillator (14). When the frequency division value of the frequency divider (15) is 1, the frequency divider (15) may be unnecessary and the output of the voltage controlled oscillator (14) is inputted as a feedback signal to the phase comparator (11).

The lock detection circuit (20) has a first and a second input terminals and one output terminal and is provided with a first and a second counters (21,22) for inputting as a first and a second signals a feedback signal and a reference signal inputted to two input terminals of the phase comparator (11) for phase comparison from a first and a second input terminals and counting the first and second signals; a comparison circuit (23) for outputting a signal in a first logical state when a count value of the first counter (21) is a predetermined first value and a count value of the second counter (22) is the first value; a third counter (24) allowed to be count enable (count operation permitted) when the signal outputted from the comparison circuit (23) is in a first logical state for counting the feedback signals; and a decision circuit (25) for outputting a signal showing a lock state when a count value of the third counter (24) coincides with a predetermined second value.

When the count value of the first counter (21) is a predetermined first value (=NA) and the count value of the second counter (22) is also the first value (=NA) (see FIG. 2), the third counter (24) for counting the feedback signals counts up. When the count value of the third counter (24) reaches a predetermined second value, the decision circuit (25) outputs a signal showing a lock state.

The decision circuit (25) outputs a signal showing an unlock state when the count value of the first counter (21) reaches a predetermined first value and the count value of the second counter (22) is different from the first value. As one example of a logic realizing this control, the comparison circuit (23) performs control to reset the third counter (24) when the count value of the first counter (21) reaches a predetermined first value and the count value of the second counter (22) is not the first value. When the count value of the third counter (24) is reset to 0, the decision circuit (25) may output a decision signal having a value showing an unlock state.

In an embodiment of the present invention, an unlock state is detected during a period in which the first counter (21) counts feedback signals inputted by a first value, and a lock state is detected during a period of the number of cycles of a value obtained by multiplying the first value and the second value (the number of cycles of the feedback signal).

EMBODIMENTS

Figure 9:
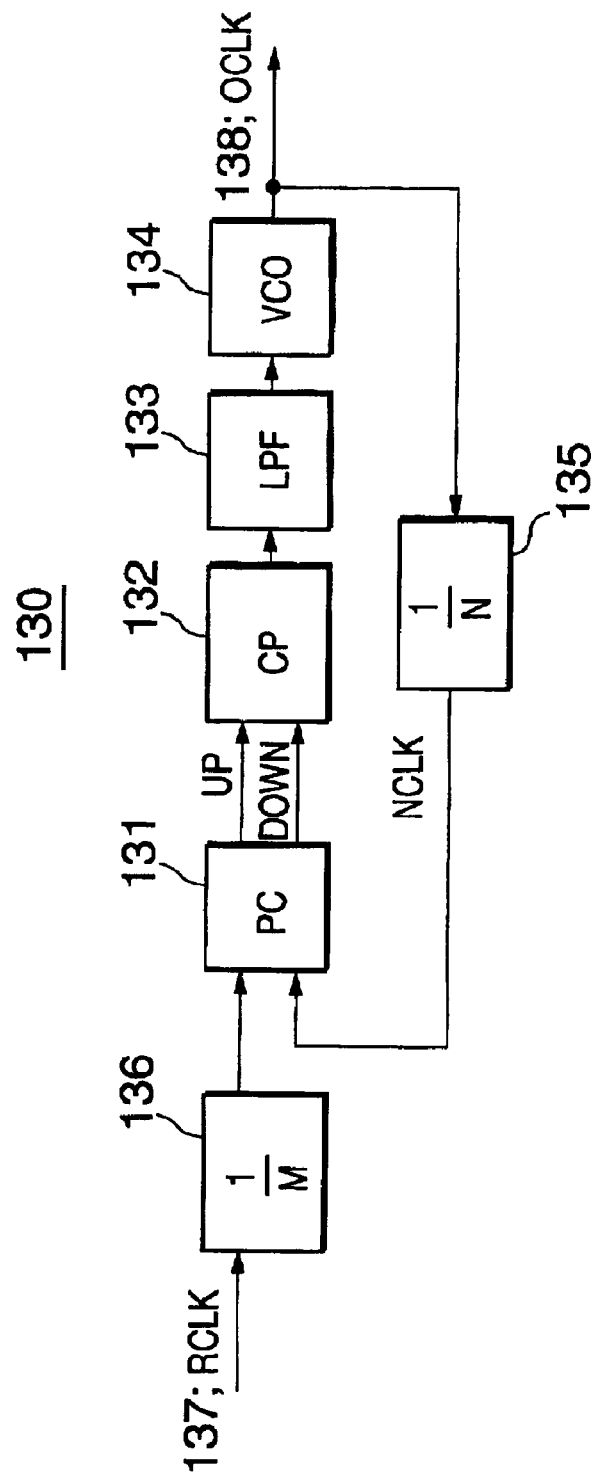
FIG. 9 is a diagram showing an example of the construction of a prior art PLL circuit.

In order to describe the embodiment of the present invention in greater detail, an embodiment applying the present invention will be described hereinbelow. FIG. 1 is a diagram showing the construction of an embodiment of the present invention. A PLL circuit 10 has a phase comparator (PC) 11; a charge pump 12 for controlling supply of charging and discharging currents to a capacitance, not shown, by an UP signal and a DOWN signal outputted from the phase comparator 11; a loop filter 13 consisting of a low-pass filter to flatten the terminal voltage of the capacitance; a voltage controlled oscillator (VCO) 14 for inputting as a controlled voltage the output voltage of the loop filter 13 to vary an oscillation frequency according to the controlled voltage value; and a frequency divider (DIV) 15 for dividing the output frequency of the voltage controlled oscillator 14. The phase comparator 11 compares the phases between an input reference signal (refereed to as a "reference signal") and a frequency division output signal (referred to as a "feedback signal") from the frequency divider 15. When the frequency division value is 1, the frequency divider 15 may be unnecessary. In the PLL circuit, as described with reference to FIG. 9, the input reference signal may be divided by M using the frequency divider to divide the input signal, which is then supplied to the phase comparator (M=1 and N=1 maybe accepted). The voltage controlled oscillator may be a current controlled oscillator.

In an embodiment of the present invention, a lock detection circuit 20 inputs a reference signal and a feedback signal inputted from two input terminals to the phase comparator 11 for lock decision to output a lock detection signal from the output terminal and has a first, a second and a third counters 21, 22 and 24, a comparison circuit 23, and a decision circuit 25.

The first counter 21 counts up on the rising edge of the inputted feedback signal. The second counter 22 counts up on the rising edge of the inputted reference signal.

The comparison circuit 23 for inputting and comparing a count value of the first counter 21 and a count value of the second counter 22 allows an output signal to be in an active state when the count value of the first counter 21 is a predetermined set value "NA" and the count value of the second counter 22 is also the set value "NA".

The comparison circuit 23 allows an output signal to be in an inactive state to the third counter 24 when the count value of the first counter 21 does not coincide with the set value "NA" or the count value of the second counter 22 does not coincide with the set value "NA".

The comparison circuit 23 resets the first counter 21 and the second counter 22 when the count value of the first counter 21 reaches the set value "NA". The first counter 21 and the second counter 22 allow the respective count values to be zero.

The third counter 24 is allowed to be count enable (count permitted) when the output signal from the comparison circuit 23 is in an active state and counts on the rising edge of the feedback signal inputted. The third counter 24 is allowed to be count disable (count unpermitted) when the output signal from the comparison circuit 23 is in an inactive state and does not perform a count operation of the feedback signal.

The decision circuit 25 compares the count value of the third counter 24 with a predetermined set value "C" and allows a lock detection signal to be in an active state when both coincide with each other.

When the output signal outputted from the decision circuit 25 has a value showing a lock state, the third counter 24 stops the count operation of the feedback signals inputted and holds the value "C" as a count value outputted.

The comparison circuit 23 resets the third counter 24 when the count value of the first counter 21 reaches the set value "NA" and the count value of the second counter 22 is not "NA". The count value of the third counter 24 is 0. The count value of the third counter 24 and the value "C" do not coincide with each other. The decision circuit 25 outputs an output signal having a value showing an unlock state.

The count values of the first counter 21 and the second counter 22 are changed to 1, 2, 3, ..., and NA-1. Each time both are "NA", the third counter 24 counts up in a manner of 1, 2, 3, ..., and C-1. The first counter 21 and the second counter 22 successively count the feedback signals by the number of cycles by NA×C (corresponding to a period of tCK×NA×C when a cycle of the feedback signal is tCK). The decision circuit 25 allows the lock detection signal to be in an active state (that is, a lock state). For the NA and C values, an optional combination of 16 and 256, 256 and 8 and the like can be applied and can be set suitably according to the frequency band of the PLL circuit and an application system.

The count values of the first to third counters 21, 22 and 24 until the lock detection are changed as follows.

| counters 21, | 22 | | counter 24 |
|---|---|---|---|
| 1, | 2, | ..., | NA | 1 |
| 1, | 2, | ..., | NA | 2 |
| ... | ... | ... | NA | ... |
| 1, | 2, | ..., | NA | C |

The first counter 21 and the third counter 24 count the feedback signals by NA×C cycles in total. When the decision circuit 25 outputs a lock detection signal in an active state, the first counter 21 counts the feedback signals from count value=0. When the count value reaches "NA" and the count value of the second counter 22 is "NA", the decision circuit 25 continues to hold the lock detection signal in an active state.

The decision circuit 25 has a logical product (AND) circuit having coincidence detection circuits arranged in parallel for coincidence detecting the count value of the third counter 24 and the value "C" (binary display data) for each bit and outputting as a lock detection signal the logical product of the outputs of the coincidence detection circuits.

As a modification of the embodiment shown in FIG. 1, when the frequency of the output signal of the PLL circuit is "N" times (multiply-by-N) a frequency of the reference signal and the frequency division value of the frequency divider 15 is "N", the output signal of the PLL circuit is inputted as a first signal to the first counter 21 and the reference signal is inputted to the second counter 22. The comparison circuit 23 allows the output signal to be active when the first counter 21 counts the first signals by "NA×N" and the second counter 22 counts the reference signals by "NA". The third counter 24 is allowed to be in a count enable state. The third counter 24 counts the first signals. When the count value of the third counter 24 reaches "C", the decision circuit 25 outputs a signal showing a lock state.

Figure 3:
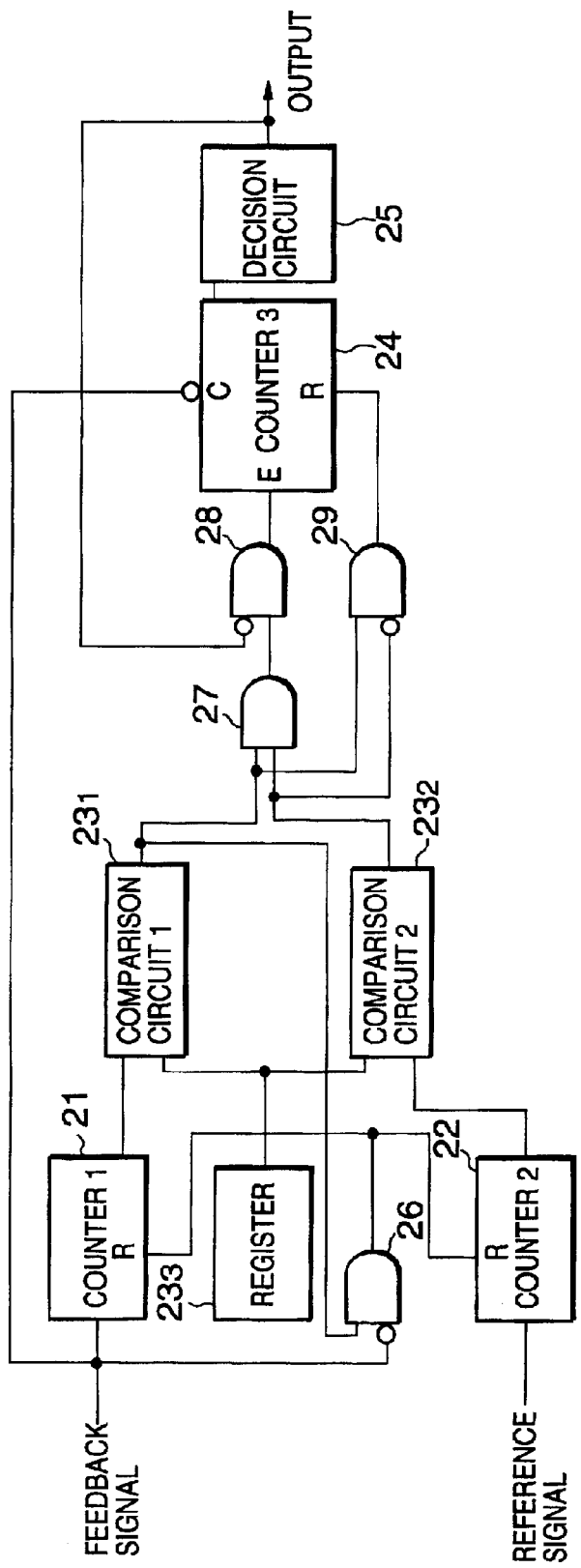
FIG. 3 is a diagram showing an example of a lock detection circuit of an embodiment of the present invention.

FIG. 3 is a diagram showing a specific example of the construction of the lock detection circuit 20 shown in FIG. 1. The same components of FIG. 3 as FIG. 1 are indicated by similar reference numerals.

The count value of the first counter 21 for performing a count operation on the rising edge of the feedback signal feedback inputted to one input terminal of the phase comparator (the numeral 11 of FIG. 1) of the PLL circuit (the numeral 10 of FIG. 1) and the value of a register 233 storing a predetermined set value NA are inputted to a first comparison circuit 231 for comparison.

The count value of the second counter 22 for performing a count operation on the rising edge of the reference signal inputted to the other input terminal of the phase comparator (the numeral 11 of FIG. 1) of the PLL circuit and the value of the register 233 are inputted to a second comparison circuit 232 for comparison.

Figures 6, 7:
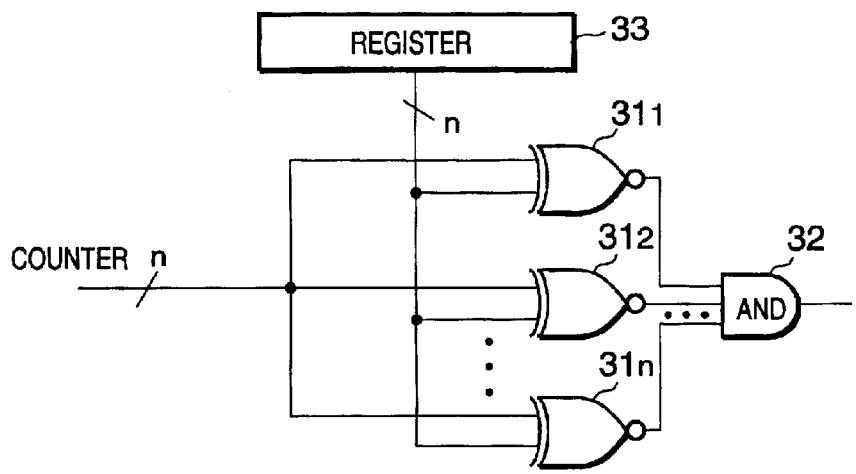
FIG. 6 is a diagram showing a truth table of assistance in explaining the operations of the decision circuit of FIG. 4.
FIG. 7 is a diagram showing an example of the construction of a comparison circuit of FIG. 3.
Figure 8:
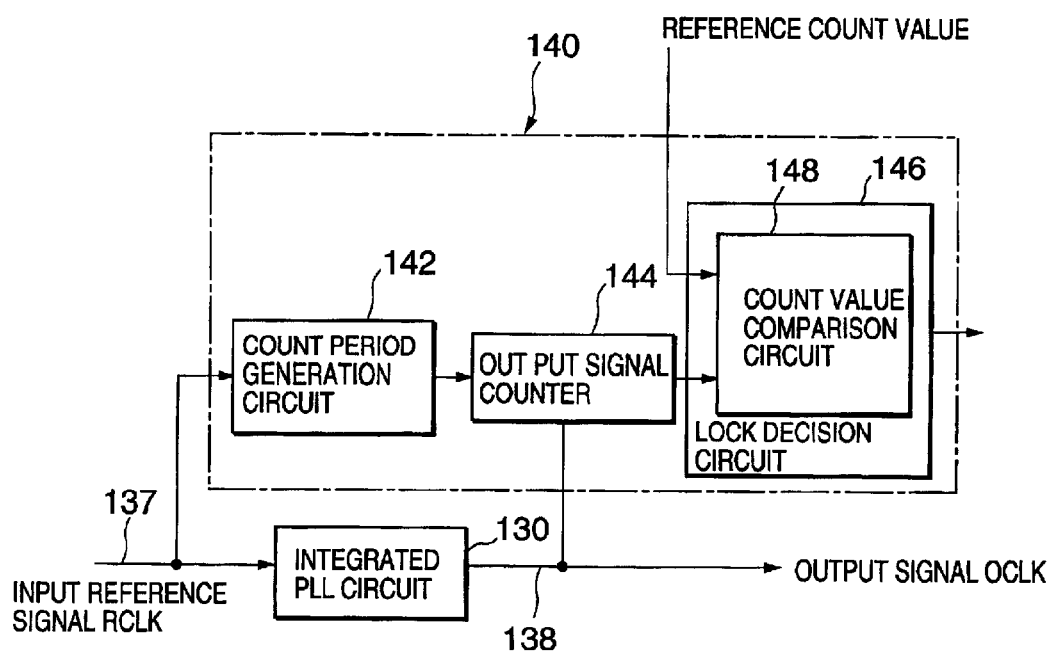
FIG. 8 is a diagram showing the construction of a prior art lock decision circuit.

The first and second comparison circuits 231 and 232 consist of a circuit as shown in FIG. 7. They have n-piece coincidence detection circuits (exclusive-NOR circuits) 311 to 31n arranged in parallel for comparing n bits of a register 33 of FIG. 7 (corresponding to the register 233 of FIG. 3) with n bits of the counter value of the counter, and an AND circuit 32 for outputting as a comparison result signal the logical product of the coincidence detection circuits (exclusive-NOR circuits) 31 to 31n. When the count value of the counter coincides with the value of the register, a High level signal is outputted from the AND circuit 32.

The output signal of the first comparison circuit 231 is inputted to a first input terminal of the first AND circuit 26 functioning as a counter reset circuit. An output signal of the logical product of the output signal and the feedback signal (inverted) inputted to a second input terminal of the first AND circuit 26 is inputted to a reset terminal R of the first counter 21 and a reset terminal R of the second counter 22. The second input terminal of the first AND circuit 26 at Low level is allowed to be in an active state. When the first AND circuit 26 outputs a High level output signal from its output terminal when the feedback signal inputted to the second input terminal is at Low level and the output of the first comparison circuit 231 inputted to the first input terminal is at High level. Upon reception of the High level output signal from the first AND circuit 26, the first counter 21 and the second counter 22 are reset.

The output signals (comparison result signals) of the first and second comparison circuits 231 and 232 are inputted to the first and second input terminals of a second AND circuit 27. The output terminal of the second AND circuit 27 is connected to a second input terminal of a third AND circuit 28. The output terminal of the third AND circuit 28 is connected to a count enable terminal of the third counter 24. The first input terminal of the third AND circuit 28 at Low level is allowed to be in an active state. The output signal of the decision circuit 25 is inputted to the first input terminal. The third AND circuit 28 outputs a High level output signal when the output signal of the decision circuit 25 inputted to its first input terminal is at Low level (unlock state) and a signal inputted to its second input terminal is at High level. To the input terminal of negative logic such as the first input terminal of the third AND circuit 28, a signal obtained by inverting an input signal by an inverter may be supplied to the input terminal of positive logic.

The third counter 24 is allowed to be in a count operation permitted state when the count enable terminal is at High level (active state) and performs a count-up operation on the falling of the feedback signal inputted.

The decision circuit 25 compares the count value of the third counter 24 inputted with the constant "C" and outputs a High level output signal (the lock detection signal of FIG. 1) from the output terminal when these coincide with each other. The decision circuit 25 is similar to the construction shown in FIG. 7. The register 33 of FIG. 7 stores binary display data of the constant C. The coincidence detection circuits 31 of FIG. 7 are arranged in parallel in number corresponding to the number of bits of the counter.

A fourth AND circuit 29 of FIG. 3 inputs the comparison result signal outputted from the first comparison circuit 231 to the first input terminal and inputs the comparison result signal (inverted) outputted from the second comparison circuit 232 to the second input terminal. Its output terminal is connected to a reset terminal of the third counter 24. The fourth AND circuit 29 supplies a High level output signal to the reset terminal R of the third counter 24 when the comparison result signal of the first comparison circuit 231 inputted to the first input terminal is at High level and the comparison result signal of the second comparison circuit 232 inputted to the second input terminal is at Low level, and resets the third counter 24.

Figure 2:
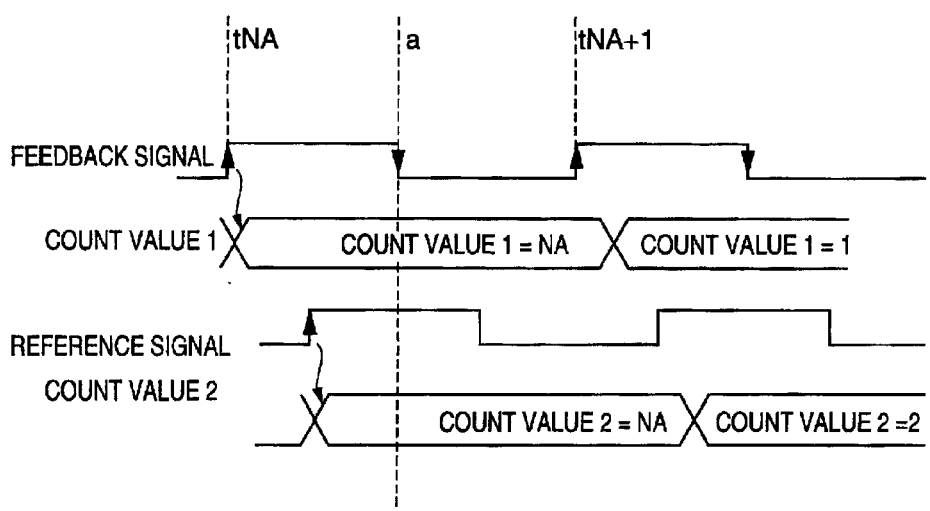
FIG. 2 is a diagram showing timing operations of an embodiment of the present invention.

The operation of the lock detection circuit of an embodiment of the present invention will be described. FIG. 2 is a timing chart of assistance in explaining the operation of an embodiment of the present invention. FIG. 2 shows operation timings for two cycles in which the count value of the first counter 21 (the count value 1) is "NA" for reset and the count value of the first counter 21 (the count value 1) is "1" in the next feedback signal cycle.

Upon rising transition from the Low level to the High level of the feedback signal, the first counter 21 performs a count-up operation. Upon rising transition from the Low level to the High level of the reference signal, the second counter 22 performs a count-up operation.

The count value of the first counter 21 (the count value 1) is "NA" on the rising (timing tNA of FIG. 2) of the feedback signal. The output signal of the first comparison circuit 231 is at High level. The first AND circuit 26 allows its output signal to be at High level when the feedback signal is at Low level with timing a of FIG. 2. The first counter 21 and the second counter 22 for inputting the output signal of the first AND circuit 26 to the reset terminal R are reset (with timing after the timing a and before the timing tNA+1 of FIG. 2). The respective count values are "0" (not shown in FIG. 2).

On the rising of the feedback signal with the timing tNA+1, the first counter 21 counts up and its count value is "1". On the rising of the reference signal, the second counter 22 counts up and its count value is "1".

While both of the comparison result signals of the first and second comparison circuits 231 and 232 are at High level (the count values of the first and second counters 21 and 22 are NA), the output signal of the second AND circuit 27 is at High level. When a signal outputted from the output terminal of the decision circuit 25 (the lock detection signal) is at Low level, the output signal of the third AND circuit 28 is at High level. The third counter 24 is allowed to be in a count enable state to count up upon falling transition of the feedback signal. With the timing a of FIG. 2 (the falling timing from High level to Low level of the feedback signal), the first and second counters 21 and 22 have not been reset yet (that is, are slower than timing ta in which the first and second counters 21 and 22 are reset and the respective count values are zero) Both of the comparison result signals of the first and second comparison circuits 231 and 232 are at High level. The third counter 24 is allowed to be in a count enable state. On the falling edge from High level to Low level of the feedback signal, the third counter 24 counts up.

When the comparison result signal of the first comparison circuit 231 is at High level (the count value of the first counter 21 coincides with "NA") and the comparison result signal of the second comparison circuit 232 is at Low level (the count value of the second counter 22 does not coincide with "NA"), the output signal of the fourth AND counter 29 is at High level to reset the third counter 24. The count value of the third counter 24 is "0".

In the third counter 24, an event in which both the comparison result signal of the first comparison circuit 21 and the second comparison result signal are at High level (the count value of the first counter 21 coincides with "NA" and the count value of the second counter 22 coincides with "NA") is successively repeated a predetermined number of times (C times) The count value of the third counter 24 counts up in a manner of 1, 2, 3, . . . , and C-1 upon falling transition of from High level to Low level of the feedback signal. When the count value of the third counter 24 is "C", the decision circuit 25 outputs a signal in a lock state. In this embodiment, the first counter 21 and the second counter 22 perform a count operation on the rising edge of the feedback signal and the reference signal. The third counter 24 performs a count operation on the falling edge of the feedback signal. The timings of the count operations of the first and second counters 21 and 22 and the third counter 24 are shifted from each other. Timing margin is held, permitting a stable operation insusceptible to variation in production and enabling precise lock/unlock detection.

Before the count value of the third counter 24 reaches "C", when the first counter 21 counts the feedback signal by "NA" (the output of the first comparison circuit 231 is at High level) and the count value of the second counter 22 as the reference signal is not "NA", the third counter 24 is reset to restart a count operation of the feedback signals from the count value "0" of the third counter 24. In other words, an event in which when the count value of the first counter 21 is "NA", the count value of the second counter 22 is also "NA" is successively repeated K times (K<C) (the count value of the third counter 24 is changed in a manner of 1, . . . , and K). Thereafter, when the count value of the first counter 21 is "NA" and the count value of the second counter 22 is not "NA", the third counter 24 is reset so that its count value is "0". In this case, the count value of the third counter 24 is different from "C" and the output signal of the decision circuit 25 is at Low level (unlock state). An unlock state can be detected in each NA cycle of the feedback signal.

When the output signal of the decision circuit 25 is at High level (lock state), the output signal of the third AND circuit 28 is at Low level and the count enable terminal E of the third counter 24 is at Low level (count disable state), the third counter 24 does not perform a count-up operation on the falling edge of the feedback signal. The first and second counters 21 and 22 and third counter 24 are reset to initialization at turn-on.

Figure 4:
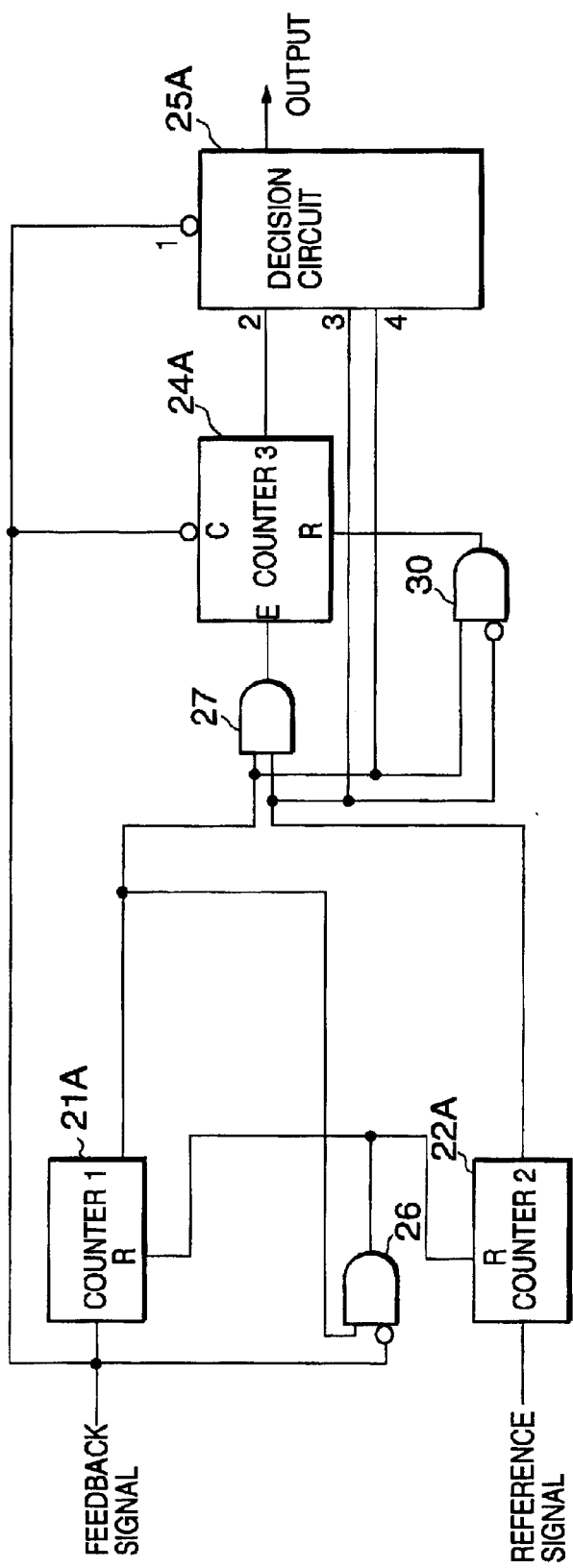
FIG. 4 is a diagram showing an example of a lock detection circuit of another embodiment of the present invention.

A second embodiment of the present invention will be described. FIG. 4 is a diagram showing the construction of a lock detection circuit of the second embodiment of the present invention. In the second embodiment of the present invention, a first counter 21A, a second counter 22A and a third counter 24A count a predetermined set value and then output an output signal (1-bit signal) in a state showing coincidence (for example, High level). In such a construction, the construction including the first comparison circuit 231, the second comparison circuit 232 and the register 233 shown in FIG. 3 is unnecessary. As the output signal of the first counter 21A, the second counter 22A and the third counter 24A, an overflow signal outputted when the upper limit value (the set value) of the counter value is reached may be used.

A first AND circuit 26 functions as a counter reset circuit as in the above-described embodiment. When the first counter 21A counts the feedback signals by the value "NA", the output signal of the first counter 21A is at High level and the feedback signal is at Low level, the output signal is allowed to be at High level.

The first and second counters 21A and 22A for inputting the output signal of the first AND circuit 26 to the reset terminal R receive a High level output signal from the first AND circuit 26 and are reset. The respective count values are zero. The output signals of the first and second counters 21A and 22A are allowed to be at Low level. When the output signals of the first and second counters 21A and 22A are at Low level, the output of the first AND circuit 26 is at Low level. The first and second counters 21A and 22A and the third counter 24A are reset to initialization at turn-on.

The output terminal of a second AND circuit 27 for inputting the output signals of the first and second counters 21A and 22A to the first and second input terminals is connected as a count enable signal to the count enable terminal E of the third counter 24. When the output signals of the first and second counters 21A and 22A are at High level, the second AND circuit 27 outputs High level to allow the third counter 24A to be in a count enable state. The third counter 24A in a count enable state counts up on the falling edge of the feedback signal inputted. When the third counter 24A counts a predetermined value "C", the third counter 24A outputs a High level output signal. The count enable state of the third counter 24A is once in even a shortest cycle in which the first counter 21A counts the feedback signals by "NA". The period includes timing of falling from High level to Low level of the feedback signal.

In a third AND circuit 30 for inputting the output signal of the first counter 21A and the output signal (inverted) of the second counter 22A, when the output signal of the first counter 21A and the output signal of the second counter 22A are at High level and Low level, respectively, a High level output signal is outputted from the output terminal, which is then supplied to the reset terminal R of the third counter 24A. The third counter 24A in which the reset terminal R is at High level is reset so that the count value is "0" and the output signal is at Low level.

A decision circuit 25A inputs a feedback signal (inverted), the output signal of the third counter 24A, the output signal of the first counter 21A and the output signal of the second counter 22A as signals 1, 2, 4 and 3 from the input terminal and outputs a signal showing a lock state or an unlock state (the lock detection signal of FIG. 1) from the output terminal.

An example of the function of the decision circuit 25A will be described below. The decision circuit 25A latch outputs a signal of having a value (High level) showing a lock state on the rising of the feedback signal (inverted) 1 (the falling of the feedback signal), when the output signal 4 of the first counter 21A is at High level, the output signal 3 of the second counter 22A is at High level, and the output signal 2 of the third counter 24A is at High level.

The decision circuit 25A latch outputs a signal having a value (Low level) showing an unlock state on the rising of the feedback signal (inverted) 1 (the falling of the feedback signal) when the output signal 4 of the first counter 21A is at High level and the output signal 3 of the second counter 22A is at Low level.

When the output signal 4 of the first counter 21A is at Low level (that is, the count value of the first counter 21A is other than the value "NA"), the decision circuit 25A holds the state (the output signal is not changed).

The decision circuit 25A updates its output logical value according to the lock/unlock state when the output signal 4 of the first counter 21A is at High level (that is, when the count value of the first counter 21A is "NA"), the output signal 2 of the third counter 24A is at High level, or the output signal 3 of the second counter 22A is at Low level. For example, when the output signal 2 of the third counter 24A is at High level and the output signal 3 of the second counter 22A is at High level, the unlock state is transited to the lock state. When the output signal 3 of the second counter 22A is at Low level, it becomes in an unlock state. In this embodiment, when it becomes in an unlock state after detecting the lock state, the signal in an unlock state in a period for "NA" cycles of the feedback signals is outputted.

Figure 5:
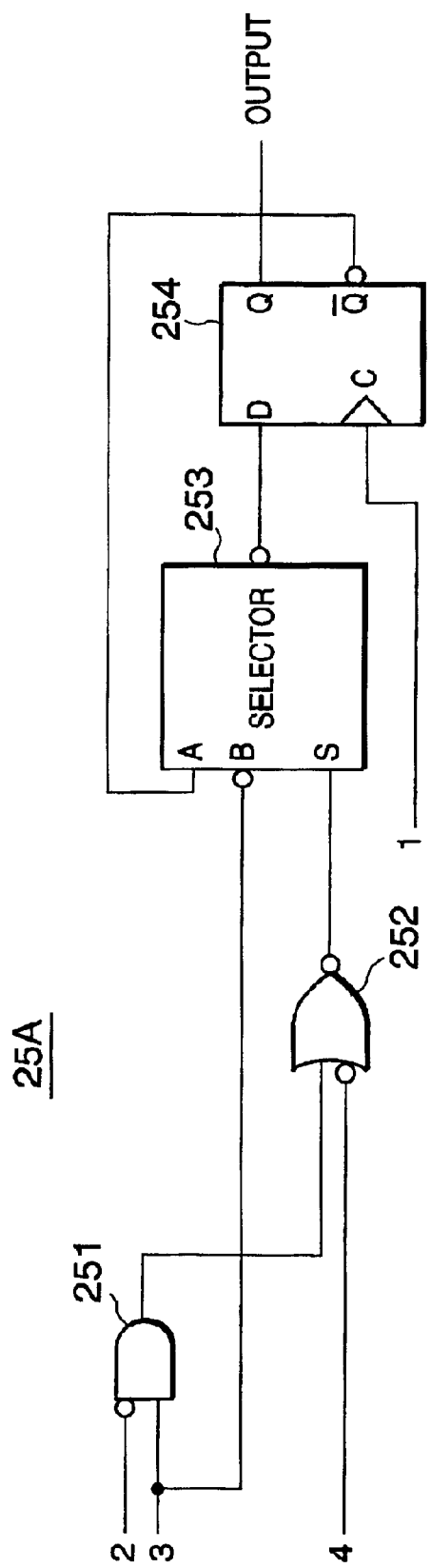
FIG. 5 is a diagram showing an example of the construction of a decision circuit of FIG. 4.

FIG. 5 is a diagram showing an example of the construction of the decision circuit 25A of FIG. 4. Referring to FIG. 5, the decision circuit 25A has an AND circuit 251 for inputting the signals 2 and 3; a NOR circuit 252 for inputting the output signal of the AND circuit 251 and the signal 4 (inverted); a selector 253 for inputting the signal 3 and the inverted output Q of a D type flip flop 254 from A and B terminals, inputting the output signal of the NOR circuit 252 to a selection signal terminal S, selecting one of signals inputted to the A and B terminals based on the value of the selection signal terminal S and inverting and outputting the signal; a D type flip flop 254 for sampling the inverted signal of the output of the selector 253 on the rising edge of the feedback signal (inverted) 1 (the falling edge of the feedback signal) and outputting it from the output terminal Q.

The selector 253 selects one of two inputs based on the value of the selection signal terminal S and has, for example, a first 3 state inverter having an input terminal connected to the A terminal and a second 3 state inverter having an input terminal connected to the B terminal via an inverter. The outputs of the first and second 3 state inverters are commonly connected. A selection signal is inputted to the output enable terminal of the second 3 state inverter. A signal obtained by inverting the selection signal by an inverter is inputted to the output enable terminal of the first 3 state inverter. When the selection signal is at Low level, the first 3 state inverter is allowed to be in an output enable state and the second 3 state inverter is allowed to be in a high impedance state. When the selection signal is at High level, the second 3 state inverter is allowed to be in an output enable state and the first 3 state inverter is allowed to be in a high impedance state.

The AND circuit 251 outputs a High level signal when the output signal 2 of the third counter 24A is at Low level (while the count value of the third counter 24A does not coincide with the set value "C") and the output signal 3 of the second counter 22A is at High level. The AND circuit 251 also outputs a Low level signal when the output signal 2 of the third counter 24A is at High level or the output signal 3 of the second counter 22A is at Low level.

The NOR circuit 252 outputs a High level signal when the output signal 4 of the first counter 21A is at High level (the first counter 21A counts the feedback signals by "NA") and the output signal of the AND circuit 251 is at Low level and supplies it to the selection signal terminal S of the selector 253. At this time, the selector 253 selects and outputs (invert outputs) the output signal 3 (inverted) of the second counter 22A inputted to the B terminal. The signal inputted to the B terminal of the selector 253 is invert inputted and invert outputted. Equivalently, the input signal in this state (in a non-inverted state) is supplied to the data input terminal D of the D type flip flop 254.

The NOR circuit 252 outputs a Low level signal when the output signal 4 of the first counter 21A is at Low level (while the first counter 21A counts the feedback signals by NA) and supplies it to the selection signal terminal S of the selector 253. At this time, the selector 253 selects the A terminal to output the inverted signal. The signal obtained by inverting the inverted output QB of the D type flip flop 254 is inputted to the data input terminal D of the D type flip flop 254. The D type flip flop 254 samples the signal of the data input terminal D on the rising of the feedback signal (inverted) 1 (the falling of the feedback signal), which is then outputted from the non-inverted output terminal Q. For this reason, the logical value of the output signal of the output terminal Q of the D type flip flop 254 (the output signal of the decision circuit 25A) is not changed (the state immediately before it is held).

When the NOR circuit 252 outputs a Low level signal when the output signal of the AND circuit 251 is at High level, that is, the output signal 2 of the third counter 24A is at Low level (while the count value of the third counter 24A becomes "C") and when the output signal 3 of the second counter 22A is at High level (while the count value of the second counter 22A is NA), which is then supplied to the selection signal terminal S of the selector 253. At this time, the selector 253 selects the A terminal to input a signal obtained by inverting the inverted output QB of the D type flip flop 254 to the data input terminal D of the D type flip flop 254. Also in this case, the value of the output signal of the D type flip flop 254 is not changed.

FIG. 6 summarizes the operations of the decision circuit 25A and shows its truth table. In FIG. 6, to facilitate the description of the circuit operation of FIG. 5, a combination of signals included in a first row is shown on a forth row. FIG. 6 indicates the High level of the signal of FIG. 5 as logic "1" and the Low level of the signal of FIG. 5 as logic "0". Referring to FIGS. 5 and 6, the operations of the second embodiment of the present invention will be described.

(1) When the output signal 4 of the first counter 21A is at Low level (0), the NOR circuit 252 outputs Low level (0) and the selector 253 selects the A terminal for output. The selector 253 selects the output of the inverted output QB of the D type flip flop 254 inputted to the A terminal and invert outputs the same, which is then supplied to the data input terminal D of the D type flip flop 254. The D type flip flop 254 sample outputs the output signal of the selector 253 on the rising edge of the feedback signal (inverted) 1. The output Q value is not changed. The D type flip flop 254 holds the state.

(2) When the output signal 3 of the second counter 22A is at Low level (0), the output signal of the AND circuit 251 is at Low level. When the output signal 4 of the first counter 22A is at High level (1) and the output signal 3 of the second counter 22A is at Low level (0), the AND circuit 30 of FIG. 4 supplies a High level signal to the reset terminal R of the third counter 24A. The third counter 24A is reset.

When the output signal 4 of the first counter 21A is at High level (1), the output signal 3 of the second counter 22A is at Low level (0) and the output signal of the AND circuit 251 is at Low level, the NOR circuit 252 outputs High level (1) to the selection signal terminal S of the selector 263. The selector 253 in which the selection signal terminal S is at High level selects High level as the output signal 3 (inverted) of the second counter 22A inputted to the B terminal and outputs Low level (0) as a signal obtained by inverting the same to the data input terminal D of the D type flip flop 254. The D type flip flop 254 samples the signal of the data input terminal D on the rising timing of the feedback signal (inverted) 1 to output Low level (unlock state) from the output terminal Q.

(3) When the output signal 3 of the second counter 22A is at High level (1) and the output signal 2 of the third counter 24A is at Low level (0), the AND circuit 251 outputs High level as its output signal. At this time, the NOR circuit 252 outputs Low level not by the value of the output signal 4 of the first counter 21A. The selector 253 selects and outputs the signal of the A terminal. For this reason, the D type flip flop 254 for latching the signal of the data input terminal D with the rising timing of the feedback signal (inverted) 1 does not change the state.

(4) When the output signal 4 of the first counter 21A is at Low level (0), the output signal 3 of the second counter 22A is at High level (1) and the output signal 2 of the third counter 24A is at High level (1), the NOR circuit 252 for inputting the output signal 4 of the first counter 21A outputs Low level. The selector 253 selects and outputs the signal of the A terminal. The D type flip flop 254 for latching the signal of the data input terminal D with the falling timing of the feedback signal (inverted) 1 does not change the state (holds the state).

(5) When the output signal 4 of the first counter 21A is at High level (1), the output signal 3 of the second counter 22A is at High level (1) and the output signal 2 of the third counter 24A is at High level (1), the output signal of the AND circuit 251 is allowed to be at Low level and the NOR circuit 252 outputs High level. The selector 253 selects the output signal High level of the second counter 22A inputted to the B terminal and outputs it to the data input terminal D of the D type flip flop 254. The D type flip flop 254 sample outputs the signal of the data input terminal D on the rising edge of the feedback signal (inverted) to output a High level (lock) output signal.

As a modification of the constructions of FIGS. 3 and 4, the output signal (a frequency obtained by multiplying that of the reference signal by N) of the PLL circuit is used as the feedback signal inputted. A frequency of the feedback signal is "N" times that of the reference signal. When the first counter 21A for inputting the feedback signal counts the feedback signals by "NA×N", the output signal is allowed to be at High level. When the second counter 22A counts the reference signals by "NA", the output signal is allowed to be at High level. The third counter 24A is allowed to be in a count enable state and the third counter 24A counts up falling timing of the feedback signal. When the third counter 24A counts the set value "C", the output signal is allowed to be at High level.

The present invention is described above with the embodiments. The present invention is not limited to the constructions of the embodiments and may include various modifications and corrections which can be executed by those skilled in the art within the scope of claims.

As described above, the present invention has at least a first and a second counters for counting feedback signals and reference signals and a third counter for counting the number of coincidences of the set values in the first and second counters. The number of comparison decisions for performing lock decision is not once but the number of times by the set value of the third counter. When the count value of the first counter is a set value and the count value of the second counter does not coincide with the set value, an unlock state is detected quickly. The unlock detection time can be shortened. The respective detection times of a lock state and an unlock state can be set optimally.

What is claimed is:

1. A lock detection circuit comprising:

an oscillator for outputting an output signal;

a phase comparator for inputting as a feedback signal said output signal of said oscillator or a signal obtained by dividing said output signal by a frequency divider from one input terminal, inputting a reference signal from the other input terminal, and comparing the phases of these signals to output a phase comparison result;

a charge pump for charging and discharging a capacitance based on said phase comparison result outputted from said phase comparator to generate a voltage corresponding to a phase difference between said feedback signal and said reference signal; and a filter for flattening the voltage corresponding to said phase difference, wherein a phase lock of a PLL (Phase Locked Loop) circuit in which based on an output of said filter, said oscillator varies its oscillation frequency, is detected, the lock detection circuit further comprising:

a first counter for inputting and counting said feedback signals inputted to said one input terminal of said phase comparator;

a second counter for inputting and counting said reference signals inputted to said other input terminal of said phase comparator;

a third counter for performing a count operation when a count value of said first counter coincides with a predetermined first value and a count value of said second counter coincides with said first value; and a decision circuit for outputting a signal showing a lock state when a count value of said third counter coincides with a predetermined second value.

2. The lock detection circuit according to claim 1, further comprising a comparison circuit for outputting a signal in a state showing coincidence when a count value of said first counter coincides with a predetermined first value and a count value of said second counter coincides with said first value, wherein said third counter inputs said signal outputted from said comparison circuit as a signal for controlling a count operation and is allowed to be in a count enable state when said signal outputted from said comparison circuit is in a state showing said coincidence to count said feedback signals inputted from said third counter.

3. The lock detection circuit according to claim 1, wherein said decision circuit performs control for updating or holding the state of a signal outputted using as a minimum unit a period during which said first counter counts said feedback signals by said first value.

4. The lock detection circuit according to claim 1, wherein when in said comparison circuit, a count value of said first counter coincides with said first value and a count value of said second counter is a value different from said first value, said decision circuit outputs a signal showing an unlock state.

5. The lock detection circuit according to claim 2, wherein when a count value of said first counter coincides with said first value and a count value of said second counter does not coincide with said first value, said comparison circuit resets said third counter, and when a count value of said third counter is reset, said decision circuit outputs a signal showing an unlock state.

6. The lock detection circuit according to claim 1, wherein when said signal outputted from said decision circuit shows a lock state, at least while said first counter counts said first signals by said first value, said third counter holds a count value coinciding with said second value without performing a count operation.

7. A lock detection circuit comprising:

an oscillator for outputting an output signal;

a phase comparator for inputting as a feedback signal said output signal of said oscillator or a signal obtained by dividing said output signal by a frequency divider from one input terminal, inputting a reference signal from the other input terminal, and comparing the phases of these signals to output a phase comparison result;

a charge pump for charging and discharging a capacitance based on said phase comparison result outputted from said phase comparator to generate a voltage corresponding to a phase difference between said feedback signal and said reference signal; and a filter for flattening the voltage corresponding to said phase difference, wherein a phase lock of a PLL (Phase Locked Loop) circuit in which based on an output of said filter, said oscillator varies its oscillation frequency, is detected, the lock detection circuit further comprising:

a first counter with a reset function for inputting and counting said feedback signals inputted to said one input terminal of said phase comparator;

a second counter with a reset function for inputting and counting said reference signals inputted to said other input terminal of said phase comparator;

a first comparison circuit for inputting a count value of said first counter and outputting an output signal in a state showing coincidence when the count value coincides with a predetermined first value;

a second comparison circuit for inputting a count value of said second counter and outputting an output signal in a state showing coincidence when the count value coincides with said first value;

a first reset circuit for generating a reset signal for resetting said first and second counters with a predetermined timing before said first counter counts said feedback signals next time when said first counter counts said feedback signals by said first value and an output signal of said first counter is allowed to be in a state showing said coincidence;

a first logical circuit for inputting output signals outputted respectively from said first and second comparison circuits and outputting an output signal in a first logical state when these output signals are both in a state showing said coincidence;

a second logical circuit for inputting a decision signal and an output signal of said first logical circuit and outputting an output signal in a first logical state when said decision signal shows an unlock state and an output signal of said first logical circuit is in a first logical state;

a third counter with a reset function for inputting an output signal of said second logical circuit to a count enable terminal and being allowed to be in a count enable state to count feedback signals inputted when the output signal of said second logical circuit is in a first logical state;

a decision circuit for inputting a count value of said third counter and outputting said decision signal in a state showing lock when the count value coincides with a predetermined second value; and a second reset circuit for outputting a signal for resetting said third counter when an output signal of said first comparison circuit is in a state showing coincidence and an output signal of said second comparison circuit is in a state showing non-coincidence.

8. A lock detection circuit comprising:

an oscillator for outputting an output signal;

a phase comparator for inputting as a feedback signal said output signal of said oscillator or a signal obtained by dividing said output signal by a frequency divider from one input terminal, inputting a reference signal from the other input terminal, and comparing the phases of these signals to output a phase comparison result;

a charge pump for charging and discharging a capacitance based on said phase comparison result outputted from said phase comparator to generate a voltage corresponding to a phase difference between said feedback signal and said reference signal; and a filter for flattening the voltage corresponding to said phase difference, wherein a phase lock of a PLL (Phase Locked Loop) circuit in which based on an output of said filter, said oscillator varies its oscillation frequency, is detected, the lock detection circuit further comprising:

a first counter with a reset function for inputting and counting feedback signals inputted to said one input terminal of said phase comparator and outputting an output signal in a state showing coincidence when said feedback signals are counted by a predetermined first value;

a second counter for inputting and counting reference signals inputted to said other input terminal of said phase comparator and outputting an output signal in a state showing coincidence when said reference signals are counted by said predetermined first value;

a first reset circuit for generating a signal for resetting said first and second counters with a predetermined timing before said first counter counts said feedback signals next time when said first counter counts said feedback signals by said first value and an output signal of said first counter is allowed to be in a state showing said coincidence;

a first logical circuit for inputting output signals of said first and second counters and outputting a signal in a first logical state when these output signals are both in a state showing said coincidence;

a third counter with a reset function for inputting an output signal from said first logical circuit to a count enable terminal, being allowed to be in a count enable state to receive and count said feedback signals inputted when the output signal from said first logical circuit is in a first logical state, and outputting an output signal in a state showing coincidence when counting to a predetermined second value;

a decision circuit for inputting said feedback signal and output signals of said first to third counters, outputting a decision signal in a logical state showing lock when the output signals of said first to third counters are all in a state showing said coincidence, and outputting a decision signal in a logical state showing unlock when the output signal of said first counter is in a state showing said coincidence and the output signal of said second counter is in a state showing non-coincidence; and a second reset circuit for outputting a signal for resetting said third counter when an output signal of said first counter is in a state showing said coincidence and an output signal of said second counter is in a state showing non-coincidence.

9. The lock detection circuit according to claim 8, wherein said decision circuit holds a state of a decision signal when an output signal of said first counter is in a state showing non-coincidence and has means for updating a value of said decision signal when an output signal of said third counter is in a state showing said coincidence or an output signal of said second counter is in a state showing said non-coincidence each time an output signal of said first counter is allowed to be in a state showing said coincidence.

10. The lock detection circuit according to claim 8, wherein said decision circuit has means for causing said decision signal to transit from an unlock state to a lock state by transition of said feedback signal when an output signal of said first counter becomes in a state showing said coincidence, an output signal of said third counter is in a state showing said coincidence and an output signal of said second counter is in a state showing said coincidence, and for allowing said decision signal to be in an unlock state by transition of said feedback signal when an output signal of said first counter becomes in a state showing said coincidence and an output signal of said second counter is in a state showing non-coincidence.

11. The lock detection circuit according to claim 1, wherein said first counter performs a count operation on one of edges of rising and falling of said feedback signal, and said third counter performs a count operation on the other edge of rising and falling of said feedback signal when it is in a count enable state.

12. The lock detection circuit according to claim 8, wherein said decision circuit comprises:

a first control circuit consisting of a logical circuit having at least a first input terminal, a second input terminal and one output terminal wherein an output signal of said third counter and an output signal of said second counter are inputted from said first input terminal and said second input terminal, respectively, a signal in a second logical state is outputted from said output terminal when the output signal of said third counter is in a first logical state or the output signal of said second counter is in a second logical state, and a signal in a first logical state is outputted from said output terminal when the output signal of said third counter is in a second logical state and the output signal of said second counter is in a first logical state;

a second control circuit consisting of a logical circuit having at least a first input terminal, a second input terminal and one output terminal wherein an output signal of said first counter and an output signal of said first control circuit are inputted from said first input terminal and said second input terminal, respectively, and a signal in a first logical state is outputted from said output terminal when the output signal of said first counter is in a first logical state and the output signal of said first control circuit is in a second logical state;

a selector having at least a first input terminal, a second input terminal, a selection signal input terminal and one output terminal wherein an output signal of said second control circuit is inputted as a selection signal to said selection signal input terminal and one of signals inputted respectively to said first input terminal and said second input terminal is selected to be outputted from said output terminal; and a latch circuit for inputting the output signal of said selector to a data input terminal and latch outputting the signal of said data input terminal by said feedback signal inputted to a clock input terminal, wherein the output of said latch circuit is feedback inputted to said first input terminal of said selector, the output signal of said second counter is inputted to said second input terminal of said selector, and said selector selects and outputs the signal of said first input terminal of said selector when said selection signal inputted is in a second logical state and selects and outputs the signal of said second input terminal of said selector when said selection signal is in a first logical state.

13. The lock detection circuit according to claim 12, wherein said first counter performs a count operation on one of edges of rising and falling of said feedback signal, said third counter performs a count operation on the other edge of rising and falling of said feedback signal when it is in a count enable state, and said latch circuit latches a signal of said data input terminal on the other edge of rising and falling of said feedback signal.

14. A lock detection circuit in which a phase lock of a PLL (Phase Locked Loop) circuit generating an output signal having a frequency one or a predetermined times a frequency of an input signal is detected, comprising:

at least a first and a second input terminals and one output terminal wherein a signal obtained by dividing said output signal of said PLL circuit by a frequency division value 1 or N (provided that N is an integer of 2 or more defined by said predetermined times value) and said input signal of said PLL circuit are inputted as a first signal and a second signal from said first input terminal and said second input terminal;

a first counter for counting said first signals;

a second counter for counting said second signals; and a circuit for detecting occurrence of an event in which when said first counter counts said first signals by a predetermined first value, said second counter counts said second signals by a predetermined second value, the lock detection circuit further comprising:

said second value being defined from said first value and said frequency division value;

a third counter for counting occurrences of said event; and a decision circuit for outputting a signal showing a lock state from said output terminal when said third counter counts the occurrences of said event by a predetermined third value, wherein said decision circuit outputs a signal showing an unlock state from said output terminal when said first counter counts said first signals by said first value and said second counter counts said second signals by a value different from said second value.

15. A lock detection circuit, comprising:

a phase comparison circuit for comparing the phases between a reference signal and a feedback signal based on an output signal to output a comparison result;

an oscillation circuit for changing an oscillation frequency of said output signal based on said comparison result; and a detection circuit for detecting that coincidence of a frequency of said feedback signal and a frequency of said reference signal is maintained during a predetermined period to allow a lock signal to be active, wherein said detection circuit includes a first counter for performing a count operation based on said feedback signal, a second counter for performing a count operation based on said reference signal, a third counter for performing a count operation in response to said feedback signal when a count value of said first counter is a first value and a count value of said second counter is said first value, and a decision circuit for allowing a lock detection signal to be active when a count value of said third counter becomes a second value.

16. The lock detection circuit according to claim 15, wherein a count value of said third counter is reset when a count value of said first counter is said first value and a count value of said second counter is not said first value.

17. The lock detection circuit according to claim 15, wherein said first counter allows a first counter output signal to be active when its count value becomes said first value and said second counter allows a second counter output signal to be active when its count value becomes said first value.

18. The lock detection circuit according to claim 15, further comprising a reset circuit for resetting said first and second counters when said first counter output signal becomes active.

19. The lock detection circuit according to claim 15, wherein said reset circuit resets said first and second counters when said first counter output signal becomes active in response to a feedback signal.

20. The lock detection circuit according to claim 15, wherein said detection circuit allows a lock detection signal to be inactive when a count value of said third counter is not a second value.

* * * * *